United States Patent [19]
Wandel

[11] Patent Number: 5,218,612
[45] Date of Patent: Jun. 8, 1993

[54] SIMPLIFIED COMBINATION LASER DIODE PROTECTIVE CIRCUIT

[75] Inventor: Peter Wandel, Berlin, Fed. Rep. of Germany

[73] Assignee: Robert Bosch GmbH, Stuttgart, Fed. Rep. of Germany

[21] Appl. No.: 766,002

[22] Filed: Sep. 26, 1991

[30] Foreign Application Priority Data

Oct. 2, 1990 [DE] Fed. Rep. of Germany ....... 4031066

[51] Int. Cl.[5] ............................................... H01S 3/00
[52] U.S. Cl. ........................................................ 372/38
[58] Field of Search ................. 372/29, 31, 26, 32, 372/38

[56] References Cited

U.S. PATENT DOCUMENTS

| | | | |
|---|---|---|---|
| 3,806,829 | 4/1974 | Duston et al. | 372/25 |
| 4,237,427 | 12/1980 | Holland | 372/29 |
| 4,924,473 | 5/1990 | Burgyan et al. | 372/26 |
| 4,982,407 | 1/1991 | Murase | 372/31 |

Primary Examiner—Léon Scott, Jr.
Attorney, Agent, or Firm—Frishauf, Holtz, Goodman & Woodward

[57] ABSTRACT

To protect a laser diode (LD) against both excessive input signal levels and electrostatic charges, a high-frequency limiting circuit (BE) and a high-frequency damping circuit (AT) are interconnected, and additionally coupled to a source of bias voltage ($U_{DC}$). The high-frequency limiting circuit has two Schottky diodes (D1, D2), biassed for non-conduction, and the damping circuit a PIN diode (D3) likewise biassed for high-resistance value. Upon exceeding a threshold as set by the bias voltage, diodes (D1, D2) become conductive and symmetrically limit the signal, and diode (D3) additionally dampens the signal; an electrostatic charge to the input control the diodes into conductive state and limits the value of energy transferred to the laser diode (LD) to a safe value.

8 Claims, 1 Drawing Sheet

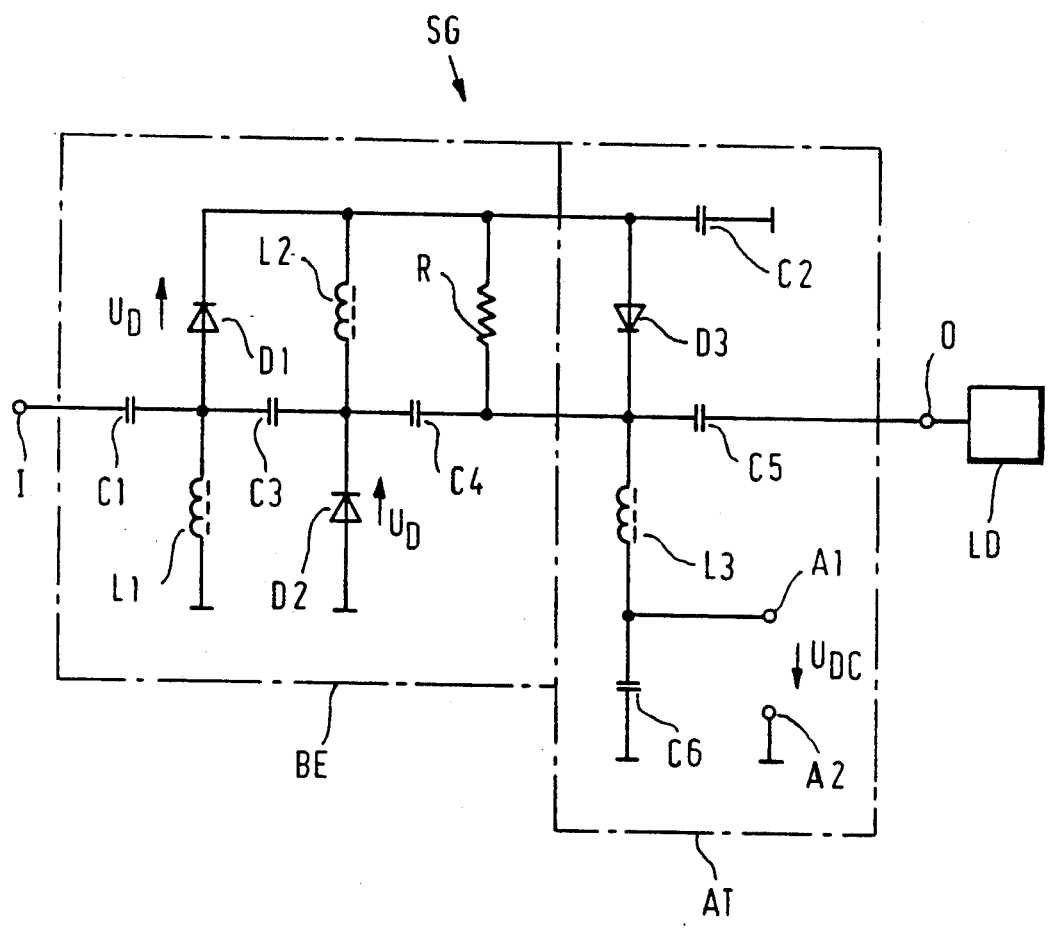

1

SIMPLIFIED COMBINATION LASER DIODE PROTECTIVE CIRCUIT

FIELD OF THE INVENTION

The present invention relates to laser diodes, and more particularly to a protective circuit to prevent damage to the laser diode not only upon occurrence of peaks in input signals but also due to electrostatic charges.

BACKGROUND

Various types of protective circuits for laser diodes are known, which are intended to protect the laser diode against damage due to excessive input voltages, for example due to high-frequency signals which exceed a predetermined thresholds. Such circuits, referred to as RF—limiter circuits, are comparatively complex and expensive. The circuits of the prior art could not protect a laser diode against electrostatic charges.

THE INVENTION

It is an object to provide a protective circuit which is simple, inexpensive to construct, and protects the laser diode not only against excessive radio frequency or other high-frequency, high-level signals but also electrostatic charges.

Briefly, a combined high-frequency limiting circuit and high-frequency damping circuit is provided. Preferably, the high-frequency limiting circuit includes two diodes, suitably Schottky diodes, and the high-frequency damping circuit includes a further diode, which is preferably a PIN diode. A d-c supply voltage is provided, biassing the two high-frequency limiting circuits to block the diodes so long as the high-frequency signal is below a certain threshold level, and the further diode has no current flowing therethrough. If the signal level exceeds a predetermined value, the diodes become conductive and, symmetrically, limit the signal to its threshold value. Due to this limiting, current will flow through the diodes and, also, then through the third diode which will be controlled into low-resistance state and, additionally, dampens the high-frequency signal. The value of the d-c voltage determines the threshold. If an electrostatic charge is present, for example in the form of positive or negative voltage peaks applied to the input of the protective circuits, the diodes again are controlled to conductive state, limiting the voltage values to the diode voltage plus the d-c voltage. The further diode, in those conditions, remains at high resistance value, that is, blocked.

The circuit has the advantage that it is simple to construct, requiring only well known and easily connected or integrated circuit elements, and responds not only to high-frequency signals exceeding a threshold, but also blocks electrostatic charges, which might, absent this circuit, destroy the laser diode. It has the additional advantage that it can easily be set to different threshold levels.

DRAWING

The single FIGURE is a highly schematic block circuit diagram of the protective circuit for a laser diode, shown schematically only as LD.

DETAILED DESCRIPTION

Referring to the single FIGURE of the drawing, the protective circuit SG has two parts, namely a high-frequency limiting circuit portion BE and a high-frequency damping circuit portion AT. The input terminal I is coupled through a capacitor C1 to the anode of a first diode D1 and additionally to an inductance L1, which has its other terminal connected to ground. The junction between the capacitor C1, diode D1 and inductance L1 is coupled through a third capacitor C3 to a further junction of a second diode D2, a second inductance L2, and yet another capacitor C4. The second diode D2 has its other terminal connected to ground or chassis. The capacitor C4, leading from the second junction, is coupled through a resistor R to a junction point of the second terminal of the first diode D1, the inductance L2 and a third or further diode D3, as well as yet another capacitor C2, the other terminal of which is connected to ground or chassis. The resistor R3 has its first terminal connected to a junction of the capacitor C4, an output capacitor C5, the cathode terminal of the further diode D3 and one terminal of an inductance L3. The other terminal of the inductance L3 is connected to a junction between a capacitor C6, further connected to ground, and a first terminal A1 of a bias or threshold voltage $U_{DC}$. The other terminal, A2, of which is connected to ground or chassis. The capacitor C5 is connected to the output terminal 0 which is coupled to the laser diode LD.

OPERATION

Under normal operation, the level of the high-frequency signal applied to the input I is below a predetermined value. The bias voltage $U_{DC}$ is so set that, under normal operating conditions, the diodes D1 of the high-frequency limiting circuit BE are biassed in blocking direction through the third inductance L3, the resistor R and, respectively, the first inductance L1 and the second inductance L2. Consequently, diodes D1, D2 have extremely high resistance. The third diode D3 likewise is in high resistance state. High-frequency signals from the input I to the output O of the protective circuit thus are hardly influenced by the presence of the diodes and the circuit connected between terminals I and O.

If, then, the signal level at the input I exceeds a predetermined threshold value, as set by the value of the voltage $U_{DC}$, diodes D1 and D2 become conductive in, respectively, negative and positive direction, and the level of the high-frequency signal is limited, symmetrically, to a predetermined threshold value. Due to the limitation, current will flow through the diodes D1, D2 and also through the diode D3, which will be controlled to become of low resistance value, and additionally dampens the high-frequency signals. The level or value of the d-c bias voltage $U_{DC}$ determines the threshold level at which limitation will begin.

If an electrostatic charge should be applied to the input terminal, regardless of whether in positive or negative direction, resulting in positive or negative, respectively, voltage peaks at the input of the protective circuit SG, diodes D1 and D2 are controlled to be conductive, so that the voltage pulses will be limited to the safe value of $U_{DC}+U_D$, wherein $U_D$ is the voltage drop across the diode D1 or D2 respectively, and the voltage $U_{DC}$ is, again, the threshold or limiting voltage applied between terminals A1 and A2. The third diode D3 remains in its high-resistance state, that is, does not carry any current.

The first and second diodes D1 and D2, preferably, are Schottky diodes. The third or further diode D3, preferably, is a PIN diode. The inductances L1, L2, L3 preferably are ferrite core coils. The circuit is suitable as a protective circuit for high-frequency signals in a frequency range of between about 30 MHz to well over 900 MHz. The LC combination of L1, C1 and L2, C3 form high-pass filters, which filter the lower frequency portions of the pulse spectrum, which has a high portion of the energy of the pulses. Thus, effective protection for the laser diode LD is provided.

In an operating example, the following components are suitable:

laser diode LD: any type of CATV LD: Z.B. O.C. 1610 B
diodes D1, D2: HP 5082−2755
diode D3: HP 5082−3080
inductances L1, L2, L3: 10 μH RF-choke
capacitors C1, C3: 47 nF
capacitors C2: 47 nF
capacitor C4: 47 nF
capacitor C5: 47 nF
capacitor C6: 47 nF
resistor R: 10Ω
bias voltage $U_{DC}$, variable between about 3.0 V to 4.0 V volts Various changes and modifications may be made within the scope of the inventive concept.

I claim:

1. A protective circuit (SG) for a laser diode (LD) to protect the laser diode against excessive high-frequency signals as well as against electrostatic charges, comprising, an input terminal (I) adapted for connection to a signal source;

an output terminal (O) providing a signal to said laser diode (LD);

a high-frequency limiting circuit (BE), coupled to said input terminal (I), and having a first diode (D1) and a second diode (D2), oppositely poled and each having a first terminal connected to said input terminal and a second terminal connected to ground, and a bias voltage (UDC) applied to said first and second diodes to keep them in a non-conductive state whenever signal amplitude at said input terminal is within a predetermined threshold range; and a high-frequency damping circuit (AT), including a third diode (D3), normally non-conductive, connected between said high-frequency limiting circuit and said output terminal (O), said first and second diodes (D2) responding to excessive electrostatic d-c voltages applied to said input terminal by becoming conductive, thereby bleeding off said excessive voltages before they can reach said laser diode;

said first, second, and third diodes (D1,D2,D3) responding to high-frequency signals exceeding a predetermined threshold limit by becoming conductive, thereby limiting voltage of alternating signals reaching said laser diode (LD) to a range which is safely tolerated by said laser diode (LD).

2. The circuit according to claim 1, wherein said third diode (D3) is rendered normally non-conductive by application of the same bias voltage as the bias voltage applied to said first and second diodes.

3. The circuit according to claim 2, wherein said first and second diodes (D1, D2) are Schottky diodes.

4. The circuit according to claim 3, wherein said third diode (D3) is a PIN diode.

5. The circuit according to claim 2, wherein said third diode (D3) is a PIN diode.

6. The circuit according to claim 2, further comprising a first junction;

a first capacitor (C1), a first inductance (L1), and a second capacitor (C3), said first junction being connected through the first capacitor (C1) to the input terminal (I) of the high-frequency limiting circuit (BE) and to one terminal of said inductance, one terminal of the first diode, and one terminal of the second capacitor (C3), the second terminal of said first inductance being connected to chassis or ground;

a second junction;

a second inductance (L2) and a third capacitor (C4), said second diode (D2), said second inductance (L2) and said third capacitor being connected to said second junction, said second diode (D2) having its other terminal connected to ground or chassis;

a third junction;

a coupling resistor (R); a third inductance (L3) and a fourth capacitor (C5);

said resistor (R), said third inductance (L3) and said third diode (D3) being connected to said third junction;

a common fourth junction connected to the other terminal of said first diode (D1), said second inductance (L2), said coupling resistor (R), said third diode (D3), and to a coupling capacitor (C2), the other terminal of said coupling capacitor (C2) being connected to ground or chassis;

and a source of bias voltage ($U_{DC}$) having one terminal (A1) connected to the other terminal of said third inductance (L3) and a second terminal (A2) connected to ground or chassis.

7. The circuit according to claim 6, further including a sixth capacitor (C6) connected between the other terminal of the third inductance (L3) and ground or chassis, the second terminal of the fourth capacitor (C5) forming the output terminal of the protective circuit to which said laser diode (LD) is connected.

8. The circuit according to claim 6, wherein a fifth capacitor (C2), said third diode (D3), said third inductance (13) and said source of reference voltage form said high-frequency damping circuit.

* * * * *